US012799999B2

(12) United States Patent
Meckel

(10) Patent No.: US 12,799,999 B2
(45) **Date of Patent: *Nov. 17, 2026**

(54) COMPOSITE BRAKE DISKS AND METHODS FOR COATING

(71) Applicant: Tech M3, Inc., Poway, CA (US)

(72) Inventor: Nathan K. Meckel, Ramona, CA (US)

(73) Assignee: Tech M3, Inc., Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/222,158

(22) Filed: Apr. 5, 2021

(65) Prior Publication Data

US 2022/0018412 A1 Jan. 20, 2022

Related U.S. Application Data

(60) Continuation of application No. 14/629,381, filed on Feb. 23, 2015, now Pat. No. 10,968,970, which is a (Continued)

(51) Int. Cl.
*F16D 65/12* (2006.01)
*B05D 1/18* (2006.01)
(Continued)

(52) U.S. Cl.
CPC ........... *F16D 65/127* (2013.01); *B05D 1/185* (2013.01); *C23C 14/022* (2013.01);
(Continued)

(58) Field of Classification Search
CPC ................. F16D 65/127; F16D 65/125; F16D 2069/005; F16D 2069/0491; F16D 69/04;
(Continued)

(56) References Cited

U.S. PATENT DOCUMENTS 2,753,808 A 7/1956 Kluge
3,171,527 A 3/1965 Josef
(Continued)

FOREIGN PATENT DOCUMENTS

DE 538507 C 11/1931
DE 102004016092 A1 10/2005
(Continued)

OTHER PUBLICATIONS

JPH0614572U, Translation. (Year: 1994).*
(Continued)

*Primary Examiner* — Thomas J Williams

(74) *Attorney, Agent, or Firm* — The Dobrusin Law Firm, P.C.

(57) ABSTRACT

A brake disk formed of a light weight ceramic and ceramic composite materials, the brake disk having a coating overlying at least a portion of the brake disk. The brake disk includes parallel surfaces wherein at least a portion of the parallel surfaces are coated with a coating material to increase wear and decrease corrosion. The coating over the brake disk includes multiple layers of the coating material, wherein the coating material includes coating material particles configured to construct a pattern of repetition that is consistent with a lattice structure when applied over the parallel surfaces of the brake disk.

8 Claims, 4 Drawing Sheets

Related U.S. Application Data continuation of application No. 13/859,378, filed on Apr. 9, 2013, now abandoned, which is a division of application No. 12/034,599, filed on Feb. 20, 2008, now Pat. No. 8,449,943.

(60) Provisional application No. 60/890,794, filed on Feb. 20, 2007.

(51) Int. Cl.

| | |
|---|---|
| ***C23C 14/02*** | (2006.01) |
| ***C23C 14/32*** | (2006.01) |
| ***C23C 14/50*** | (2006.01) |
| ***F16D 69/04*** | (2006.01) |
| *F16D 69/00* | (2006.01) |

(52) U.S. Cl.
CPC .......... *C23C 14/025* (2013.01); *C23C 14/325* (2013.01); *C23C 14/505* (2013.01); *F16D 65/125* (2013.01); *F16D 69/04* (2013.01); *F16D 2069/005* (2013.01); *F16D 2069/0491* (2013.01); *F16D 2200/0039* (2013.01); *F16D 2200/0047* (2013.01); *F16D 2250/0046* (2013.01)

(58) Field of Classification Search
CPC ..... F16D 2200/0039; F16D 2200/0047; F16D 2250/0046; F16D 69/02; F16D 69/027; B05D 1/185; C23C 14/022; C23C 14/025; C23C 14/325; C23C 14/505
See application file for complete search history.

(56) References Cited

U.S. PATENT DOCUMENTS

| | | | | |
|---|---|---|---|---|
| 3,314,509 | A | 4/1967 | Pelikan | |
| 3,443,454 | A | 5/1969 | Hall | |
| 3,899,054 | A | 8/1975 | Huntress | |
| 3,993,415 | A | 11/1976 | Hauser | |
| 4,180,622 | A | 12/1979 | Burkhard et al. | |
| 4,290,510 | A | 9/1981 | Warren | |
| 4,428,811 | A * | 1/1984 | Sproul | C23C 14/0042 204/192.15 |
| 4,555,239 | A | 11/1985 | Miranti, Jr. | |
| 4,643,951 | A * | 2/1987 | Keem | C23C 28/00 428/421 |
| 4,933,300 | A | 6/1990 | Koinuma | |
| 5,116,691 | A | 5/1992 | Darolia | |
| 5,119,828 | A | 6/1992 | Miller | |
| 5,306,407 | A | 4/1994 | Hauzer et al. | |
| 5,407,035 | A | 4/1995 | Cole et al. | |
| 5,501,306 | A | 3/1996 | Martino | |
| 5,535,857 | A | 7/1996 | Barlow | |
| 5,629,101 | A * | 5/1997 | Watremez | F16D 65/125 188/251 A |
| 5,725,913 | A | 3/1998 | Wong et al. | |
| 5,783,295 | A * | 7/1998 | Barnett | C23C 28/04 428/472 |
| 5,789,074 | A * | 8/1998 | Moireau | C08J 5/08 428/221 |
| 5,838,522 | A | 11/1998 | Komvopoulos et al. | |
| 5,861,203 | A | 1/1999 | Yuan et al. | |
| 5,884,388 | A | 3/1999 | Patrick et al. | |
| 5,901,818 | A * | 5/1999 | Martino | F16D 69/02 188/218 XL |
| 5,922,452 | A | 7/1999 | Takahashi et al. | |
| 5,928,771 | A | 7/1999 | DeWald, Jr. et al. | |
| 6,119,828 | A | 9/2000 | Parsons | |
| 6,196,936 | B1 | 3/2001 | Meckel | |
| 6,302,246 | B1 | 10/2001 | Naumann | |
| 6,457,566 | B1 | 10/2002 | Toby | |
| 6,458,466 | B1 * | 10/2002 | Jones | F16D 69/027 192/30 R |
| 6,514,592 | B1 | 2/2003 | Hubbard et al. | |
| 6,527,092 | B2 | 3/2003 | Gruber | |
| 6,536,564 | B1 | 3/2003 | Garfinkel et al. | |
| 6,585,089 | B1 | 7/2003 | Parker | |
| 6,612,415 | B2 | 9/2003 | Yamane | |
| 6,617,057 | B2 * | 9/2003 | Gorokhovsky | C23C 14/022 428/156 |
| 6,652,718 | B1 * | 11/2003 | D'Couto | C23C 14/025 204/192.15 |
| 6,857,509 | B1 | 2/2005 | Braiato | |
| 7,097,922 | B2 | 8/2006 | Shen et al. | |
| 7,246,586 | B2 | 7/2007 | Hosenfeldt et al. | |
| 7,261,192 | B2 | 8/2007 | Khambekar et al. | |
| 7,799,420 | B2 | 9/2010 | Beck et al. | |
| 8,084,089 | B2 | 12/2011 | Meckel | |
| 8,449,943 | B2 | 5/2013 | Meckel | |
| 2002/0117360 | A1 | 8/2002 | Toby | |
| 2002/0153213 | A1 | 10/2002 | Gruber et al. | |
| 2003/0136614 | A1 | 7/2003 | Feldmann et al. | |
| 2003/0183306 | A1 | 10/2003 | Hehmann et al. | |
| 2004/0129314 | A1 | 7/2004 | Welty et al. | |
| 2004/0178029 | A1 | 9/2004 | Hoyte | |
| 2005/0056495 | A1 | 3/2005 | Greppi | |
| 2005/0087406 | A1 | 4/2005 | Meckel | |
| 2005/0183909 | A1 | 8/2005 | Rau | |
| 2005/0252739 | A1 | 11/2005 | Callahan et al. | |
| 2006/0078749 | A1 | 4/2006 | Grau | |
| 2006/0175160 | A1 | 8/2006 | Weiss | |
| 2007/0234929 | A1 | 10/2007 | Reinsch et al. | |
| 2007/0286961 | A1 | 12/2007 | Pahle | |
| 2008/0041675 | A1 | 2/2008 | Baumgartner et al. | |
| 2008/0196985 | A1 | 8/2008 | Meckel | |
| 2008/0196986 | A1 | 8/2008 | Meckel | |
| 2009/0026025 | A1 | 1/2009 | Hampton | |
| 2009/0026026 | A1 | 1/2009 | Martino | |
| 2009/0050423 | A1 | 2/2009 | Meckel | |
| 2009/0288921 | A1 | 11/2009 | Meckel | |
| 2011/0048871 | A1 | 3/2011 | Meckel | |
| 2011/0135948 | A1 | 6/2011 | Pyzik et al. | |
| 2012/0118686 | A1 | 5/2012 | Meckel | |
| 2013/0220745 | A1 | 8/2013 | Meckel | |
| 2015/0041262 | A1 | 2/2015 | Meckel | |
| 2015/0369315 | A1 | 12/2015 | Wall et al. | |

FOREIGN PATENT DOCUMENTS

| | | | | |
|---|---|---|---|---|
| DE | 102011122308 | A1 | 6/2012 | |
| EP | 1256739 | A2 | 11/2002 | |
| FR | 788671 | A | 10/1935 | |
| FR | 2807484 | A1 | 10/2001 | |
| GB | 2154614 | A | 9/1985 | |
| JP | 63-026210 | | 2/1988 | |
| JP | 63026210 | A | 2/1988 | |
| JP | 02-175859 | A | 7/1990 | |
| JP | H0614572 | U * | 7/1992 | F16D 69/02 |
| JP | 07-208520 | | 8/1995 | |
| JP | 07224390 | A | 8/1995 | |
| JP | 09118755 | A | 5/1997 | |
| JP | 2003049252 | A | 2/2003 | |
| JP | 2004-316850 | | 11/2004 | |
| JP | 16316850 | | 11/2004 | |
| JP | 2006105396 | A * | 4/2006 | F16D 65/126 |
| JP | 04312220 | B2 | 8/2009 | |
| JP | 04337126 | B2 | 9/2009 | |
| JP | 04337127 | B1 | 9/2009 | |
| KR | 10-1998-049479 | A | 9/1998 | |
| KR | 10-1999-0036405 | | 5/1999 | |
| KR | 10-2006-0051087 | A | 5/2006 | |
| KR | 2010-0098817 | A | 9/2010 | |
| WO | 9738235 | A1 | 10/1997 | |
| WO | 98/50837 | A1 | 11/1998 | |
| WO | 2006092270 | A1 | 9/2006 | |

OTHER PUBLICATIONS

JP-2006105396-A (Year: 2006).*
Translation to Michioka JP07-224390, published Aug. 1995 and cited on IDS dated Sep. 6, 2011.

(56) References Cited

OTHER PUBLICATIONS

International Search Report and Written Opinion dated Dec. 12, 2008, for PCT/US2008/073907.
International Search Report dated Aug. 6, 1998, for PCT/US1998/009303.
Extended European Search Report dated Jul. 14, 2010, for EP08798408.4.
PCT International Search Report dated Mar. 29, 2011, for PCT application No. PCT/US2010/043989.
Communication pursuant to Article 94(3) dated Aug. 24, 2011, for European patent application No. 08730296.4.
Extended European Search Report dated Dec. 27, 2010, for EP application No. 08730296.4.
Terry M. Tritt, "Thermal Conductivity: Theory, Properties and Applications", Physics of Solids and Liquids, p. 100, 2004.
Machine Translation to Kuribayashi (JP2003-049252) published Feb. 2003.
International Search Report & Written Opinion of related PCT/US08/054465, mailed Jun. 19, 2008.
Vapor deposition of platinum alloyed nickel aluminide coatings, Yu et al., Jun. 2006.
English machine translation of JP07-224390.

* cited by examiner

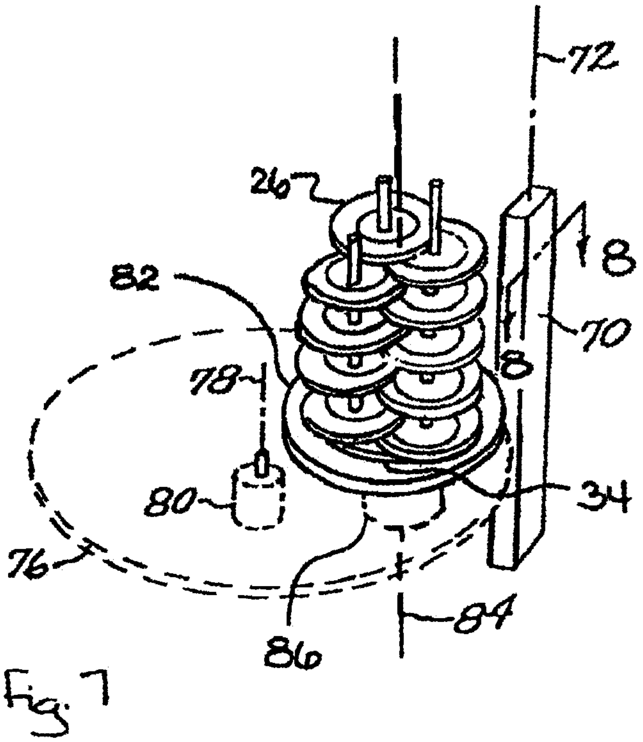
Fig. 7
FIG. 8
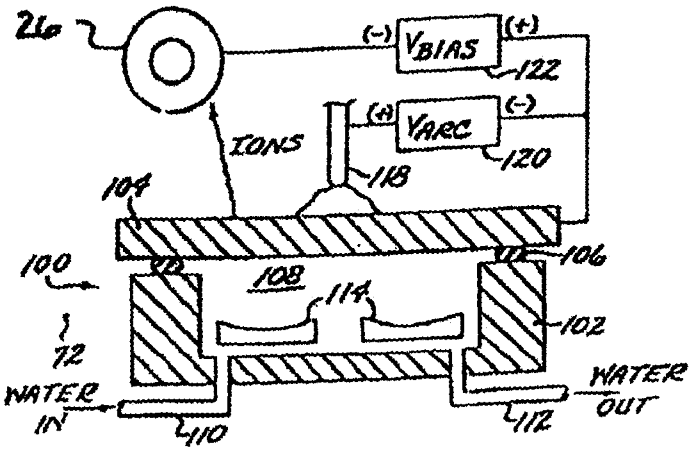

COMPOSITE BRAKE DISKS AND METHODS FOR COATING

RELATED APPLICATION

This application U.S. patent application Ser. No. 14/629,381, filed Feb. 23, 2015, which is a continuation of U.S. patent application Ser. No. 13/859,378, filed Apr. 9, 2013, which is a division of U.S. patent application Ser. No. 12/034,599, filed Feb. 20, 2008, which claims the benefit of priority of U.S. Provisional Patent Application No. 60/890,794, filed Feb. 20, 2007, each of which are hereby incorporated by reference in its entirety.

FIELD OF THE INVENTION

The present invention pertains generally to coated brake disks and drums and methods for coating brake disks and drums and is particularly concerned with brake disks and drums formed of ceramic materials or ceramic composite materials that are coated with multiple layers of a corrosion resistant coating that are configured to construct lattices or super lattice type coatings.

BACKGROUND

There are a number of reasons why it is important to minimize the weight of a brake disk (also sometimes referred to as a brake rotor). First, the weight of the brake disk contributes to the overall weight of the vehicle, and in this respect, affects the vehicle's fuel efficiency and performance. Additionally, the weight of the brake disk adds to the vehicles "unsprung weight" which is generally considered to be the primary source of vehicle noise and vibration. In addition, less energy is required to rotate a relatively light brake disk during vehicle travel, and accordingly, a reduction in brake disk weight is generally accompanied by an increase in the vehicle's fuel efficiency and performance. A final consideration, which is especially important for brake disks used on motorcycles, for example, is the effect of brake disk weight on the motorcycle's handling characteristics. In greater detail, gyroscopic inertia is generated when a brake disk is rotated. Specifically, for a given rotation velocity, a heavy brake disk generates more gyroscopic inertia that a light brake disk. This gyroscopic inertia, in turn, must be overcome by the rider to steer the motorcycle. The result is that a heavier brake disk adversely affects a motorcycle's handling characteristics.

During braking, hydraulic (or mechanical) energy is used to press the vehicle's brake pads against the rotating brake disk. The friction resulting from the moving contact between brake pad and brake disk slows the rotation of the brake disc and decreases the speed of the vehicle. This frictional contact generates heat and causes the contact surfaces on the brake pad and brake disk to wear unevenly. Excessive wear can cause the brake disk to become thin and weak. In some cases, the thinning of the brake disk becomes so severe that the brake disk is no longer able to support the stresses and heat generated during braking. The result is typically a warped brake disk that can cause undesirable brake chattering.

Conventional brake disks have typically been made of cast iron. Cast iron is relatively inexpensive, machines freely and has adequate strength and wear resistance at the relatively high brake system service temperatures. On the other hand, cast iron brake disks are relatively heavy due to the high density of cast iron. For example, the density, .rho., of cast iron is approximately 7.4 gms/cc compared to light metals such as aluminum (.rho..congruent.2.7 gms/cc) and Titanium (.rho..congruent.4.5 gms/cc).

A final factor that must be considered when designing brake rotors is aesthetics. Modern racing motorcycles have rather large diameter brake disks that are plainly visible, especially the front disk. Because of this visibility, the color and surface appearance of a brake disk can add to or detract from the overall look of the motorcycle. These considerations can affect a purchaser's decision when buying a new motorcycle and when retrofitting a motorcycle with a new brake system.

In light of the above, it is an object of the present invention to provide lightweight brake disks with better functionality.

SUMMARY

The present invention is directed to coated brake disks and methods for coating brake disks. A brake disk can be disk-shaped having a central hole (or in some cases multi-holes) to allow the brake disk to be positioned over a hub. The brake disk is further formed with a pair of flat annular surfaces that extend from the central hole to the periphery of the brake disk. These flat surfaces are provided for contact with the brake pads during braking and constitute the wear surfaces for the brake disk.

In one embodiment, the brake disk includes a light weight metal alloy such as Titanium-6 Aluminum-4 Vanadium, Titanium-6 Aluminum-2 Tin-4 Molybdenum-2 Zirconium or other light weight metal alloys in combination with light weight ceramic materials or light weight ceramic composite materials and combinations thereof, and accordingly is relatively lightweight as compared to a similarly sized brake disk made of cast iron. In one embodiment the brake disk includes non-metallic corrosion resistant materials, for example, light weight ceramic materials or light weight ceramic composite materials and combinations thereof.

The ceramic materials can include ceramic oxides (e.g. alumina and zirconia) and ceramic non-oxides (e.g. carbides borides and nitrides). A portion of the ceramic material brake disk including the wear surfaces is coated with a coating material that is wear and corrosion resistant. In one embodiment the coating can have a first layer of material having a crystalline structure. In another embodiment the disk brake is coated with multiple layers of materials configured to construct lattices or super lattice type coatings to impart specific properties to the coated brake disk Some of the coating materials can include a binary metal compound, for example, metal Nitride, a metal Oxide, a metal Boride and metal Carbide. Further, the colored (several colors available), aesthetically pleasing coating material is preferably deposited on portions of the brake disk that will be visible when the brake disk is installed on the vehicle. In some embodiments, the coating is deposited on nearly the entire brake disk.

In one embodiment the coating includes a first layer of a material having an amorphous and/or crystalline structure. The first layer of material can be a metal such as Titanium, Chromium, Zirconium, Aluminum, Hafnium or an alloy thereof. The first layer can be applied directly on the light weight metal alloy ceramic composite material brake disk. The coating further includes a second layer that overlays and contacts the first layer. The second layer preferably includes one or more Metal Nitrides, Metal Borides, Metal Carbides and Metal Oxides. More preferably, the second layer includes one or more Nitrides, Borides, Carbides or Oxides of the metal used in the first layer. For example, for a coating having Titanium as the first layer, the second layer can be Titanium Nitride (TiN). Note; the abbreviations (e.g. TiN) are used herein as a shorthand rather than an exact chemical label, and do not suggest that the stoichiometry of the indicated compound must be exactly as stated in the abbreviation. In addition, multiple layers of alternating metal or metal nitride layers can be constructed in order to impart specific physical properties to the coated brake disk.

In some embodiments, both layers of the coating are preferably applied using a physical vapor deposition source such as a cathodic arc source with a controlled gas atmosphere. Other operable techniques such as unbalanced magnetron sputtering or evaporative techniques may also be used. During coating deposition, the brake disks are positioned on a fixture and the fixture is rotated in a planetary movement about a central axis. In greater detail, the fixture includes three (or more) parallel poles that are mounted on a plate and arranged wherein each pole is spaced at an equal distance from the other two poles. A plurality of brake disks can be stacked on each pole, with spacers to separate adjacent disks within each stack. The poles are spaced from each other to allow the brake disks on one pole to overlap the brake disks on an adjacent pole. The spacers prevent brake disks on one pole from contacting the brake disks on an adjacent pole.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 7 is a schematic perspective view of a detail of the deposition apparatus of FIG. 5; and FIG. 8 is a schematic cross-sectional view of a cathodic arc source, taken along lines 8-8 of FIG. 7.

DETAILED DESCRIPTION OF THE DRAWINGS

Figure 1:
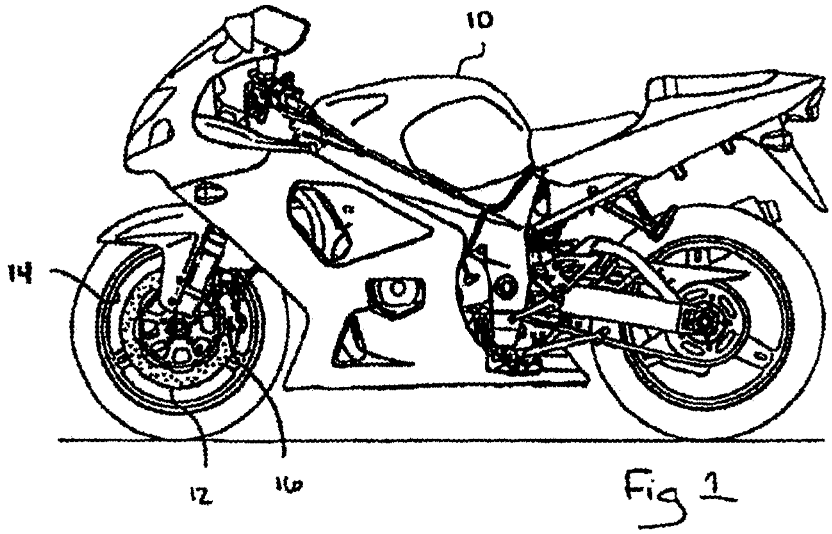
FIG. 1 is a perspective view of a motorcycle having a disk brake system.

Referring to FIG. 1, motorcycle 10 is shown that includes a disk brake system. As shown, the disk brake system includes a brake disk 12 that is attached to the front wheel 14 of the motorcycle 10 for rotation therewith. (Typically there are two brake disks attached to the front wheel and at least one if not two brake disks attached to the rear wheel.) The brake system further includes a caliper 16 having a pair of brake pads that can be selectively applied against the brake disk 12 using hydraulic pressure to slow the rotation of the brake disk 12 and wheel 14. In a typical setup, the hydraulic pressure is provided by the motorcycle operator using a hand lever mounted on the handlebars of the motorcycle 10.

Figure 2:
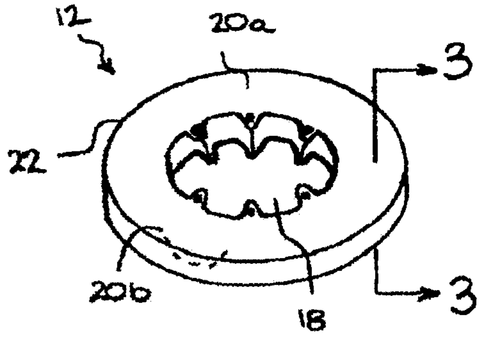
FIG. 2 is a perspective view of a coated disk brake.

A better appreciation of a brake disk 12 can be obtained with reference to FIG. 2. As shown, the brake disk 12 is disk-shaped having a central hole 18 to allow the brake disk 12 to be positioned over the hub of the wheel 14 (shown in FIG. 1). The brake disk 12 is further formed with flat annular surfaces 20*a,b* (see also FIG. 4) that extend from the central hole 18 to the periphery 22 of the brake disk 12. As shown, flat surface 20*a* is parallel with and opposed to flat surface 20*b* on the brake disk 12. These flat surfaces 20*a,b* are provided for contact with the brake pads during braking and constitute the wear surfaces for the brake disk 12.

Figure 3:
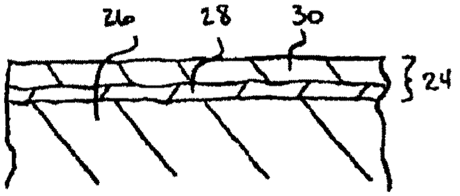
FIG. 3 is an enlarged cross-sectional view of a portion of the coated disk brake shown in FIG. 2 as seen along line 3-3 in FIG. 2 showing the coating layers.

Referring now to FIG. 3, a coating 24 is shown applied to a brake disk substrate 26. For the brake disk 12, the brake disk substrate 26 includes a light weight metal alloy such as Titanium-6 Aluminum-4 Vanadium, Titanium-6 Aluminum-2 Tin-4 Molybdenum-2 Zirconium or other light weight metal alloys in combination with light weight ceramic materials or light weight ceramic composite materials and combinations thereof, and accordingly is relatively lightweight as compared to a similarly sized and shaped brake disk made of cast iron. In one embodiment the brake disk includes non-metallic corrosion resistant or ceramic material, for example, light weight ceramic materials or light weight ceramic composite materials and combinations thereof. The ceramic materials can include ceramic oxides (e.g. alumina and zirconia) and ceramic non-oxides (e.g. carbides borides and nitrides). A portion of the ceramic material brake disk including the wear surfaces can be coated with a coating material that is wear and corrosion resistant. In one embodiment the coating can have a first layer of material having a crystalline structure. In some embodiment, the crystalline material is a metal such as Titanium, Chromium, Zirconium, Aluminum, Hafnium or an alloy thereof. Alternatively, the coating material can have an amorphous structure.

Continuing with FIG. 3, the coating 24 further includes a second layer 30 that overlays and contacts the first layer 28. The second layer 30 can include one or more Metal Nitrides, Metal Borides, Metal Carbides and Metal Oxides. In one embodiment, the second layer includes one or more Nitrides, Borides, Carbides or Oxides of the metal used in the first layer. In a some embodiments, the coating of Titanium, for example, constitutes the first layer 28 and a Titanium Nitride (TiN, $Ti_2N$, etc.) constitutes the second layer 30. With this cooperation of structure, a coating 24 having a service life to exceed approximately 100,000 vehicle miles can be obtained. In another embodiment the brake disk is coated with multiple layers of materials configured to construct lattices or super lattice type coatings to impart specific properties to the coated brake disk. The multiple layers, for example layers 28 and 30 can be configured to form a lattice structure or a super lattice structure. These are thin films formed by alternately depositing two different components to form layered structures. Multilayers become superlatices when the period of the different layers is less than 100 Å. Note: the abbreviations (e.g. TiN, $Ti{\cdot}_2N$, etc.) are used herein as a shorthand rather than an exact chemical label, and do not suggest that the stoichiometry of the indicated compound must be exactly as stated in the abbreviation. In addition, multiple alternating layers of these metals or Nitrides, Borides, Carbides or Oxides can be utilized to construct lattices or super lattice type coatings in order to impart specific physical properties to the coated brake disk.

Figure 4:
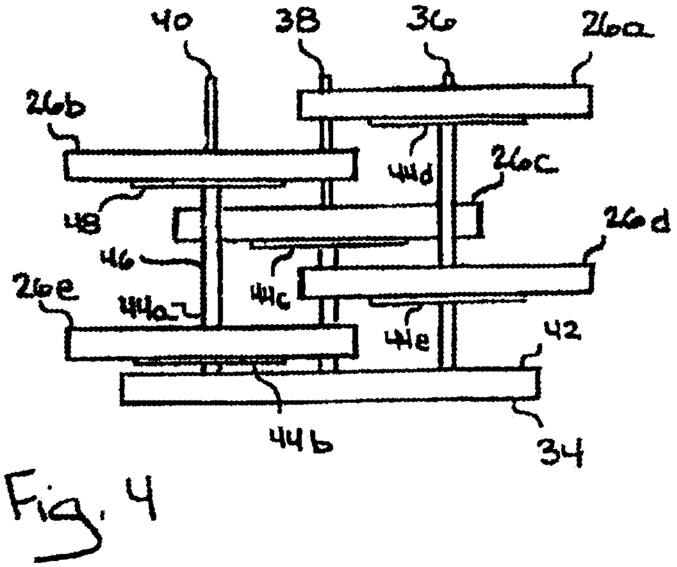
FIG. 4 is a front elevation view of a fixture for supporting the disk brakes during the coating process.
Figure 5:
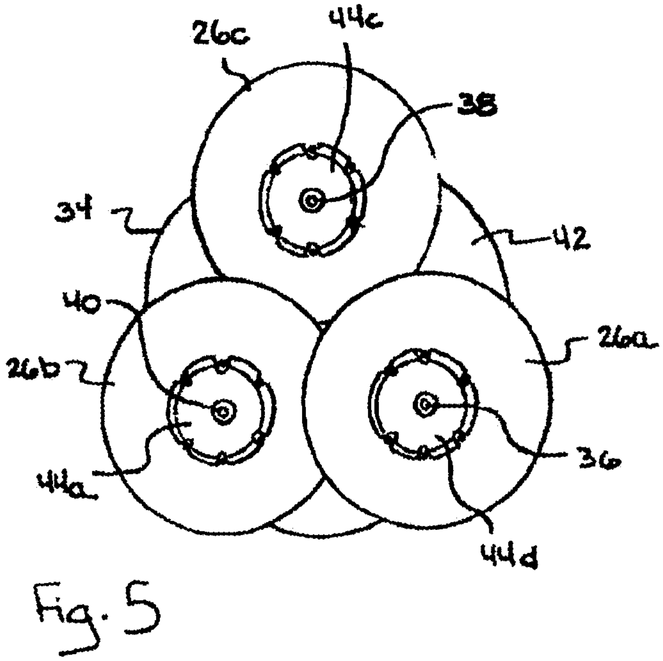
FIG. 5 is a top plan view of a fixture for supporting the disk brakes during the coating process.

Referring now with cross-reference to FIGS. 4 and 5, a fixture 34 is shown for holding the brake disk substrates 26 during coating. Although the fixture 34 is shown holding five brake disk substrates 26*a-e*, it is to be appreciated that the fixture 34 is merely exemplary and that fewer or more brake disk substrates 26 could be positioned on a fixture 34. As shown, the fixture 34 includes three parallel poles 36, 38, 40 that are mounted on and extend from a base plate 42. The parallel poles 36, 38, 40 are arranged on the base plate 42 with each pole 36, 38, 40 spaced at an equal distance from the other two poles 36, 38, 40. With this cooperation of structure, a plurality of brake disk substrates 26 can be stacked on each pole 36, 38, 40. For example, as shown, brake disk substrates 26*a* and 26*d* are stacked on pole 36, brake disk substrate 26*c* is stacked pole 38 and brake disk substrates 26*b* and 26*e* are stacked on pole 40.

Continuing with cross-reference to FIGS. 4 and 5, it can be seen that spacers 44*a-e* can be used to selectively separate adjacent brake disk substrates 26 on each pole 36, 38, 40. For the implementation shown, each spacer 44*a-e* includes a tube 46 and flange 48 allowing each spacer 44*a-e* to be slid over a respective pole 36, 38, 40 and positioned as desired. In the implementation shown in FIGS. 4 and 5, the spacing between poles 36, 38 is established to allow the brake disk substrates 26 on one pole 36, 38, 40 to overlap the brake disk substrates 26 on an adjacent pole 36, 38, 40. Also for the implementation shown in FIGS. 4 and 5, the spacers 44*a-e* have been sized to prevent brake disk substrates 26 on one pole 36, 38, 40 from contacting the brake disk substrates 26 on an adjacent pole 36, 38, 40.

Figure 6:
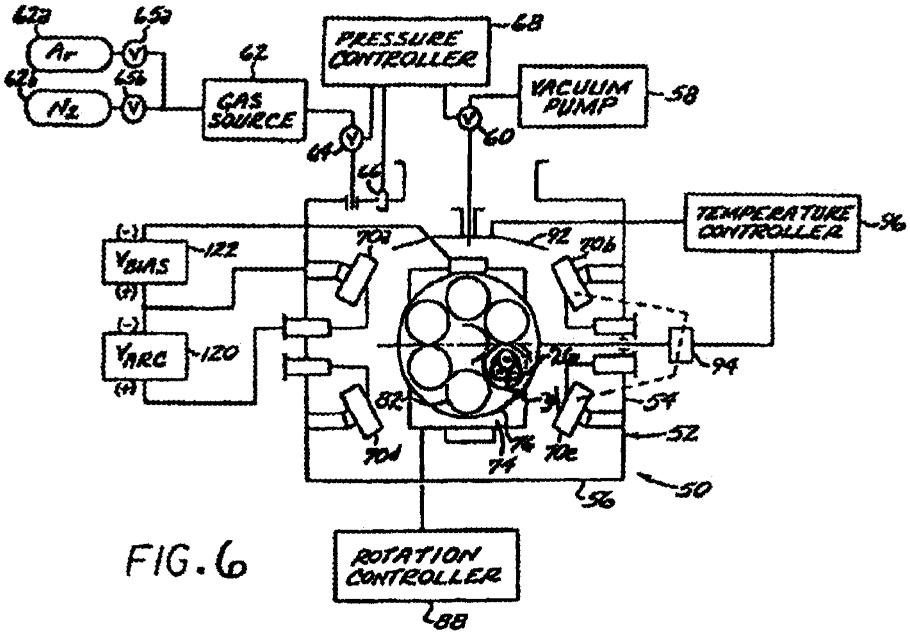
FIG. 6 is a schematic plan view and control diagram of a deposition apparatus for use in the invention.

FIGS. 6 and 7 depict a deposition apparatus 50 for coating the brake disk substrates 26, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source 62 typically includes several separately operable gas sources. The gas source 62 usually includes a source 62*a* of an inert gas such as argon and a source 62*b* of Nitrogen gas, each providing gas selectively and independently through a respective selector valve 65*a* or 65*b*. Other types of gas can also be provided as desired, such as gases required to produce borides, oxides and/or carbides.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gauge 66. Thus, the gaseous backfilled atmosphere within the chamber 52 is preferably a flowing or dynamic atmosphere.

At least two, and preferably four as shown, linear deposition sources 70 are mounted within the interior of the chamber 52 in a circumferentially spaced-apart manner. In FIG. 6, the four deposition sources are identified as distinct sources 70*a*, 70*b*, 70*c*, and 70*d*, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate 26 during deposition procedures.

A support 74 is positioned in the chamber 52. The support 74 produces a compound rotational movement of a fixture 34 mounted thereon. The preferred support 74 includes a rotational carriage 76 that rotates about an axis 78, driven by a rotational drive motor 80 below the rotational carriage 76. Mounted on the rotational carriage 76 are at least one and preferably six, as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88. The rotation controller 88 preferably rotates the rotational carriage 76 at a rate of about 1 revolution per minute (rpm).

Continuing with FIGS. 6 and 7, for deposition processing of brake disk substrates 26, a fixture 34 as described above can be mounted on the planetary carriage 82, as shown. For commercial operations, a fixture 34 having a plurality of brake disk substrates 26 is typically mounted on each planetary carriage 82 in the manner described, as illustrated for one of the planetary carriages 82 in FIG. 6.

The temperature in the chamber 52 during deposition is controlled using a heater 92 that extends parallel to the deposition sources 70 on one side of the interior of the chamber 52. The heater 92 is preferably a radiant heater operating with electrical resistance elements. The temperature of the heating array is monitored by a temperature sensor 94 such as an infrared sensor that views the interior of the chamber 52. The temperature measured by the sensor 94 is provided to a temperature control circuit 96 that provides the power output to the heater 92. Acting in this feedback manner, the temperature controller 96 allows the temperature of the heating array to be set. In the preferred processing, the heating array is heated to a temperature of from about 1000.degree. F to about 1700.degree. F.

FIG. 8 illustrates a cathodic arc source 100 used in the preferred form of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two spirally shaped (only sections of the spirals are seen in FIG. 8) permanent magnets 114 extend parallel to the source axis 72. Positioned above the deposition target 104 exterior to the body 102 is a striker electrode 118. A voltage $V_{ARC}$ is applied between the striker electrode 118 and the deposition target 104 by an arc source power supply 120. $V_{ARC}$ is preferably from about 10 to about 50 volts.

The metallic material that forms the deposition target 104 is deposited onto the brake disk substrate 26 together with, if desired, gas atoms producing gaseous species from the atmosphere of the chamber 52. For the embodiment describe herein, the deposition target 104 includes Titanium (Ti) metal.

To accomplish the deposition, an arc is struck between the striker electrode 118 and the deposition target 104, locally heating the deposition target 104 and causing Titanium atoms and/or ions to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage $V_{BIAS}$ is applied between the deposition target 104 and brake disk substrate 26 by a bias power supply 122, so that any positively charged ions are accelerated toward the brake disk substrate 26.

$V_{BIAS}$ is preferably from about −30 to about −600 volts. The value selected for $V_{BIAS}$ determines the energy of ionic impact against the surface of the substrates, a phenomenon termed ion peening. In a typical case, $V_{BIAS}$ is initially selected to be a relatively large negative voltage to achieve good adherence of the metallic first layer 28 (see FIG. 3) to the brake disk substrate 26. $V_{BIAS}$ is subsequently reduced (made less negative) when the overlying hard layer is deposited, to achieve a uniform, fine microstructure in the overlying layer. The values of $V_{BIAS}$ are desirably maintained as low as possible, consistent with obtaining an adherent coating 24. $V_{BIAS}$ is more positive than −600 volts, and most preferably more positive than −400 volts. If $V_{BIAS}$ is too negative, corona effects and back sputtering may occur at some regions of the brake disk substrate 26. Thus, while higher $V_{BIAS}$ voltages may be used in some instances, generally it is preferred that $V_{BIAS}$ be more positive than −600 volts. The cathodic arc source 100 is preferred, but other types of sources, such as sputtering sources, may also be used.

The cooperative selection of the material of the deposition target 104 and the gases introduced into the deposition chamber 52 from the gas source 62 allows a variety of coatings 24 to be deposited onto the brake disk substrate 26, within the constraints discussed previously. The total thickness of the coating 24 is preferably from about 1 to about 10 micrometers. If the coating thickness is less than about 1 micrometer, the physical properties of the coating 24 are insufficient to produce the desired results. If the coating thickness is more than about 10 micrometers, the coating 24 has a high internal stress that leads to a tendency for the coating 24 to crack and spall away from the brake disk substrate 26 during deposition or during service.

These general principles are applied in preparing the coatings 24 of interest, as described previously in relation to FIG. 3. The coating 24 of FIG. 3 includes an amorphous metallic first layer 28, such as amorphous metallic Titanium, that contacts and overlays the surface of the brake disk substrate 26. The amorphous metallic first layer 28 is deposited by backfilling the deposition chamber 52 with a small partial pressure of about 5 microns of an inert gas, such as flowing argon (flowing at a rate of about 200-450 standard cubic centimeters per minute (sccm) in the apparatus used by the inventors), and then depositing metal, such as Titanium, from the deposition target 104 with $V_{BIAS}$ about −400 volts. Because the argon does not chemically react with the metal, an amorphous metallic first layer 28 is deposited.

As shown in FIG. 3, a second layer 30, which for the embodiment described herein is a metal Nitride, overlies the amorphous metallic first layer 28. The second layer 30 is deposited by backfilling the deposition chamber 52 with a small partial pressure of about 5 microns of flowing Nitrogen (flowing at a rate of about 150-500 seen in the inventors' apparatus), and then depositing metal, such as Titanium, from the deposition target 104 with $V_{BIAS}$ about −50 volts. The metal combines with the Nitrogen to produce the metal Nitride in the second layer 30.

While the brake disks and methods for coating as herein shown and disclosed in detail are fully capable of obtaining the objects and providing the advantages herein before stated, it is to be understood that they are merely illustrative of the presently preferred embodiments of the invention and that no limitations are intended to the details of construction or design herein shown other than as described in the appended claims.

The invention claimed is:

1. A braking surface, comprising:
- a substrate material; and
- a coating overlying at least a portion of the substrate material, the coating comprising:
  - a first material comprising a vapor-deposited metal or an alloy thereof, wherein the metal is a singular element, and
  - a second material comprising a vapor-deposited binary metal compound, the first material and the second material constructing a pattern of repetition that is consistent with a super lattice structure when applied over parallel surfaces of a brake disk,
- wherein the coating has a total thickness up to 10 micrometers,
- wherein the super lattice structure has a period of repetition of less than 100 angstroms, and
- wherein the substrate material comprises ceramic.

2. The braking surface of claim 1, wherein the vapor-deposited binary metal compound in the coating has a crystalline structure.

3. The braking surface of claim 1, wherein the braking surface comprises ceramic oxides and ceramic non-oxides.

4. The braking surface of claim 1, wherein the first material of the coating comprises a first coating layer, wherein the first coating layer comprises a crystalline metal selected from the group of metals consisting of Titanium, Chromium, Zirconium, Aluminum, Hafnium, and alloys thereof.

5. The braking surface of claim 1, wherein the braking surface comprises ceramic oxides.

6. The braking surface of claim 1, wherein the braking surface comprises ceramic non-oxides.

7. The braking surface of claim 1, wherein the braking surface comprises a ceramic composite material selected from the group of ceramic composite materials consisting of particulate reinforced combinations of ceramic oxides and non-oxides in combination with lightweight ceramic materials.

8. The braking surface of claim 1, wherein the second material of the coating is selected from the group of coating materials consisting of a metal nitride, a metal oxide, a metal boride, and a metal carbide.

* * * * *